(12) United States Patent
Walsh

(10) Patent No.: US 11,295,597 B2
(45) Date of Patent: Apr. 5, 2022

(54) TAMPER DETECTION SYSTEM

(71) Applicant: Timothy Neville Walsh, Nairobi (KE)

(72) Inventor: Timothy Neville Walsh, Nairobi (KE)

( * ) Notice: Subject to any disclaimer, the term of this patent is extended or adjusted under 35 U.S.C. 154(b) by 169 days.

(21) Appl. No.: 16/766,077

(22) PCT Filed: Nov. 22, 2018

(86) PCT No.: PCT/GB2018/053375
§ 371 (c)(1),
(2) Date: May 21, 2020

(87) PCT Pub. No.: WO2019/102198
PCT Pub. Date: May 31, 2019

(65) Prior Publication Data
US 2020/0357262 A1 Nov. 12, 2020

(30) Foreign Application Priority Data
Nov. 22, 2017 (GB) .................................... 1719396

(51) Int. Cl.
*G08B 21/18* (2006.01)
*G01R 31/54* (2020.01)

(52) U.S. Cl.
CPC .......... *G08B 21/185* (2013.01); *G01R 31/54* (2020.01)

(58) Field of Classification Search
CPC .................................................. G08B 21/185
See application file for complete search history.

(56) References Cited

U.S. PATENT DOCUMENTS

| | | | |
|---|---|---|---|
| 9,741,231 B2 * | 8/2017 | Brandl ................. | G08B 21/185 |
| 10,371,737 B2 * | 8/2019 | Mukherjee ............ | G01D 5/204 |

(Continued)

FOREIGN PATENT DOCUMENTS

| | | |
|---|---|---|
| WO | WO 2004/037660 | 5/2004 |
| WO | WO 2008/091244 | 7/2008 |
| WO | WO 2017/079743 | 5/2017 |

OTHER PUBLICATIONS

International Preliminary Report on Patentability dated May 26, 2020 in International Patent Application No. PCT/GB2018/053375, pp. 1-8.

(Continued)

*Primary Examiner* — Travis R Hunnings
(74) *Attorney, Agent, or Firm* — Byrne Poh LLP

(57) ABSTRACT

A system for securely transporting an item is disclosed, the system comprising a container comprising walls defining an inner cavity and a detection means for detecting tampering, wherein the detection means is contained within the walls of the container. The system further comprises an electronic sensor module, wherein the electronic sensor module comprises a continuity sensor configured to detect a discontinuity in the detection means. The system further comprises a transmitter configured to transmit a signal indicative of whether or not the continuity sensor has detected a discontinuity in the detection means. The signal may comprise a first type of signal responsive to the continuity sensor not detecting a discontinuity in the detection means and a second type of signal responsive to the continuity sensor detecting a discontinuity in the detection means. The transmitter is further configured to transmit a signal indicative of the continuity sensor having detected a discontinuity in the detection means after a pre-determined period of time has elapsed. The system thereby provides a system for remotely detecting tampering and improving the security of transported items to an expected location.

20 Claims, 10 Drawing Sheets

(56) References Cited

U.S. PATENT DOCUMENTS

| | | |
|---|---|---|
| 2005/0275537 A1 | 12/2005 | Kerr et al. |
| 2008/0075934 A1 | 3/2008 | Barlow et al. |
| 2012/0193258 A1 | 8/2012 | Mannikko |
| 2017/0068881 A1 | 3/2017 | Camper et al. |
| 2019/0132658 A1* | 5/2019 | Mukherjee ........... G01N 27/025 |
| 2021/0165033 A1* | 6/2021 | Parois-Quelennec ....................... G01R 31/50 |

OTHER PUBLICATIONS

International Search Report and Written Opinion dated Jan. 23, 2019 in International Patent Application No. PCT/GB2018/053375, pp. 1-10.

Search Report dated Apr. 24, 2018 in GB Patent Application No. 1719396.2, pp. 1-5.

* cited by examiner

TAMPER DETECTION SYSTEM

TECHNICAL FIELD

The present disclosure relates to a tamper detection system and, in particular, to a container such as a bag which may be used to securely transport an item, such as a purchased consumer good, and confirm it has reached its intended destination with the container integrity intact. The tamper detection system may provide an indication of whether or not the system has been tampered with while the item has been sealed in the container of the system.

BACKGROUND

Secure transport of items is an increasingly important aspect of modern life, as growing numbers of consumer commodities are transported, often internationally. In many cases, couriers are utilised. Basic tracking information is widely available, but is generally limited to specific milestones, such as indications that an item has been dispatched, is in transit or has been received by a recipient. Such tracking systems generally rely on a barcode of a package being scanned at various locations, such as when leaving a factory or arriving at a distribution depot. This tracking information is limited and provides no security against tampering. There is thus a need for systems and methods that provide improved tamper-detection, location and reporting when transporting items.

Another issue concerning the secure transport of goods relates to the fact that, as international travel increases, more people purchase items while they are abroad in countries where they do not live. For example, tourists may purchase many items while on holiday in a foreign country. In many cases, the purchasers in these cases pay sales taxes, such as Value Added Tax (VAT). The purchasers are often entitled to a refund of these sales taxes, but the process is often arduous and complex. Customs regulators require proof that the purchased item has been removed from the country of purchase, before sales taxes can be refunded. This requires manual inspection of goods by customs personnel and manual processing of refund forms by refund agents. There is therefore a need for improved systems and methods for tracking purchased goods during transport.

It would be advantageous to provide systems or methods which address one or more of the above-described problems, in isolation or in combination.

SUMMARY

Aspects and features of the present disclosure are set forth below. The present disclosure provides an improved packaging for use in securely transporting items and detecting tampering or damage to the packaging during transit. The present disclosure also provides methods for improved detection and reporting of tampering using the disclosed system. Methods for using geo-location information to determine whether a package containing an item has been moved to or removed from a particular location are also provided.

The present disclosure relates generally to a system for detecting tampering and securely transporting an item, for example to a known or desired location, or within an allocated period of time. The system may comprise a container, such as a bag, box, packaging or other vessel into which items, such as consumer goods being delivered by a courier or purchased by a shopper at an airport, may be placed. An item, such as a consumer good, may be placed into the container and the container may be sealed. The system may comprise mechanisms for detecting and reporting tampering with the container. Tampering may comprise opening the container without authorisation, or before an approved time for opening the container. Tampering may also comprise damaging the container, for example through neglect or malicious intent.

In accordance with an aspect of the present disclosure, there is provided a system comprising a container comprising walls defining an inner cavity. The system may comprise a detection means for detecting tampering. The detection means may be a conductive element such as a wire carrying a current in use. The detection means may be advantageously contained within the walls of the container, in order to provide structural rigidity and to conceal the detection means. For example, the detection means may be intermediate two layers of the walls of the container. The detection means may be arranged in a mesh or wave configuration and may be advantageously distributed throughout substantially all areas of the walls of the container so that substantially all walls of the container have tamper-detection functionality. Alternatively, the detection means may be distributed throughout a majority of the walls of the container, or throughout a portion of the walls of the container. The detection means may advantageously be distributed throughout the walls of the container such that a break in the walls of the container causes a discontinuity in the detection means. A break may comprise a tear, puncture, intrusion or other damage.

The discontinuity in the detection means may comprise a break or severing in the detection means, such that the walls of the container are secured against tampering such as cutting, heating or tearing. The discontinuity may alternatively comprise a bend in the detection means, such that the walls are secured against damage that bends or impacts the walls. If current flows through the detection means, the discontinuity in the detection means may comprise and/or cause a change in the current flowing through the detection means.

The system may comprise a power source configured to deliver current to the detection means and other elements of the system. The power source may be a battery, which may be rechargeable and/or replaceable.

The system may comprise an electronic sensor module. The electronic sensor module may comprise a single or multi-channel continuity and/or resistance sensor configured to detect a discontinuity in the detection means, such as a discontinuity caused by a break in the container walls. It will be apparent that the type of continuity sensor used will be determined by the detection means used. For example, if the detection means is a wire carrying a current, the continuity sensor may be a current or resistance sensor configured to monitor the current flowing through the wire or the total resistance of the wire. In alternative implementations other detection means may be used and therefore other continuity sensors may be used. For example, in some implementations the detection means may comprise insulated magnet wire, transformer wire or insulated foil. In such implementations the continuity sensor may detect discontinuities in either the conductivity or the resistance in the wire used to create a circuit.

The system may comprise a transmitter, for example a wireless transmitter. The transmitter may be configured to transmit a signal indicative of whether or not the continuity sensor has detected a discontinuity in the detection means. The transmitter may be configured to transmit a signal until the continuity sensor detects a discontinuity in the detection means. Alternatively, the transmitter may be configured to not transmit a signal, for a pre-determined amount of time or until reset, responsive to the continuity sensor detecting a discontinuity in the detection means.

The system may comprise a detection module comprising the electronic sensor module and the transmitter.

In a preferred arrangement, the various elements described above form a circuit. In other words, the system comprises a container and a tamper detection circuit. The tamper detection circuit in this arrangement comprises the detection means, the power source, the electronic sensor module and the transmitter. In this arrangement the power source delivers current to all elements of the circuit. As the elements in combination comprise a circuit, tampering or removing any of the elements will break the circuit and cause a discontinuity which can be detected as an indication of tampering. It will be apparent that other elements can be added to this circuit, while some elements, such as the transmitter, may be separate from the circuit.

The detection means may advantageously pass around, above and/or below one or more elements or modules of the system, such as the detection module, electronic sensor module and/or the transmitter. This may ensure that attempted removal of or tampering with these module(s) causes a discontinuity in the detection means.

In a preferred implementation, the transmitter may be configured to transmit a first type of signal responsive to the continuity sensor not detecting a discontinuity in the detection means and to transmit a second type of signal responsive to the continuity sensor detecting a discontinuity in the detection means. The transmitter may be advantageously configured to continuously transmit the signal indicative of whether or not the continuity sensor has detected a discontinuity in the detection means. Thus, the transmitter may be configured to continuously transmit either the first type of signal or the second type of signal, such that the status of the detection means (and therefore the tamper-related status of the system as a whole) can be determined at any time by a device receiving the transmitted signals. In other implementations the signals may be transmitted at a pre-determined time, for a pre-determined amount of time or upon request from another device.

The transmitted signals may comprise encrypted signals. For example, in implementations comprising first and second types of signals, the first type of signal may comprise a first series of encrypted keys and the second type of signal may comprise a second series of encrypted keys. The use of encrypted keys secures the transmitted signal against tampering or alteration. The encrypted keys to be transmitted may be randomly selected from a pre-determined key registry or generated by an algorithm.

In implementations wherein the first and/or second signal comprises a first and/or second series of encrypted keys, the first and/or second series of encrypted keys may correspond with or match a database of keys. The database of keys may be used to de-encrypt the encrypted series of keys. The database may be used to identify that the first series of encrypted keys indicates that the continuity sensor has not detected a discontinuity in the detection means and/or that the second series of encrypted keys indicates that the continuity sensor has detected a discontinuity in the detection means. The database may be stored locally at a device associated with the system, such as a mobile device. Alternatively, the database may advantageously be stored at a remote device or server, further improving the security of the system by ensuring that decryption and analysis of the transmitted signals is performed at a remote device which may be under the control of a central or trusted authority rather than an individual delivery person or purchaser.

The transmitter may be configured to transmit a signal indicating that the continuity sensor has detected a discontinuity (such as a second type of signal) after a pre-determined period of time has elapsed, irrespective of whether or not the continuity sensor has actually detected a discontinuity. This provides an expiry deadline for the system after which non-tampering can no longer be proved. The inclusion of an expiry deadline improves the security of the system because the power supply of the system may have a limited lifespan. As the power supply reaches the end of its lifespan, functionality may become unpredictable and security of the system may be degraded through sub-optimal tamper-detection resulting from reduced power levels. At some point, tamper-detection functionality may cease altogether, for example if the power supply's power levels are so low, or run out altogether, that this functionality can no longer be supported. A malicious actor may desire to exploit such potential lapses in security, for example by simply waiting until the power supply of the system expires or reaches such a low level that tampering will no longer be detected and/or reported. Providing a pre-defined deadline for the system prevents such security flaws from being exploited.

The existence of a finite expiry time can also have safety advantages, for example if delivery of an item to a particular location is required by a specific deadline, such as in the case of perishable, high value or otherwise sensitive goods. Other advantages, such as commercial advantages, resulting from having a fixed expiry deadline for the system will be apparent.

In some arrangements, the transmitter may be configured to transmit a signal indicating that the continuity sensor has detected a discontinuity when instructed to do so, for example by a remote server and/or a mobile device. Similarly to the functionality just described, this enables a finite expiry deadline for the system to be implemented, after which non-tampering can no longer be proved. However, in this arrangement the expiry deadline is a result of remote instruction rather than a result of a pre-defined time period being set.

Optionally, the system may be configured to only communicate with (e.g. transmit signals to or act on signals received from) one or more particular mobile devices, for example mobile devices with which the system is paired (matched or associated). Such mobile devices may be considered "approved" mobile devices. In other words, the transmitter may be configured to only transmit the signal indicative of whether or not the continuity sensor has detected a discontinuity in the detection means to one or more approved mobile devices.

An approved mobile device may be one that was originally paired with the system upon initial start-up or activation of the system, or at some later time. This pairing may be achieved by sharing one or more encrypted keys between the mobile device and the system. For example, an encrypted key may be provided by the mobile device to the detection module (via the transmitter) or vice versa or both (i.e. keys may be exchanged in both directions during pairing). Pairing may then occur if the decrypted encrypted keys match, or satisfy some other pre-defined criteria. The encrypted key(s), and means for decrypting them, may be pre-loaded in memory in the detection module (for example the memory of the sensor module) before activation, for example during assembly of the system. A mobile device which is to be paired with the system may then be given access to corresponding encrypted key(s), or a means of decrypting relevant encrypted key(s), to facilitate the pairing. The system and mobile device may interrogate one another (or the interrogation may be one-way) at regular intervals, or each time communication between them is initiated, in order to determine whether the system and mobile device have been and/or remain paired. Interrogation may involve the transmittal of the same encrypted keys that were used during initial pairing, or it may involve the transmittal of other encrypted keys. Interrogation may thereby verify that a particular mobile device is approved to receive tamper detection information from the system. It will be apparent that this method ensures that only approved devices are able to obtain the tamper detection status of the system, thereby preventing non-authorised parties from obtaining this data and maintaining system security and integrity as the same mobile reader must be used throughout the transaction.

In some arrangements the mobile device may forward the tamper detection information on to a remote server. Optionally, this may only be possible if the mobile device is an approved mobile device.

The system may comprise a container that is sealable by one or more conductive sealing elements. The container may advantageously be sealable more than once and be made from durable, re-usable and/or environmentally friendly material suitable for multiple re-use.

The present disclosure further relates generally to a method for detecting tampering with a tamper detection system and for securely transporting an item with the system, for example to an expected or known location and/or recipient. The method may comprise sealing an item in a container of a system according to the present disclosure. The method may further comprise transmitting, by a transmitter of the system, signals indicative of whether or not tampering with the system has been detected. The transmitted signals may be analysed in order to identify whether or not tampering has been detected. The method may comprise reporting a result such as a "pass" or "fail" result, based on the analysis of the transmitted signals. The method may further comprise determining a location of the system.

In accordance with a further aspect of the present disclosure, there is provided a method for securely transporting an item using a system such as that described in any of the implementations or arrangements of the present disclosure.

In a preferred implementation, the method may comprise transmitting a signal indicative of whether or not the continuity sensor has detected a discontinuity in the detection means. The method may comprise transmitting a first type of signal responsive to a detection means of the system not detecting tampering. The method may comprise transmitting a second type of signal responsive to the detection means detecting tampering. The method may alternatively comprise not transmitting any signal for a pre-determined amount of time responsive to detecting tampering. Alternatively, the method may comprise transmitting a signal until tampering is detected.

The method may comprise sending the signal to a remote device or server. The method may comprise determining, based on the transmitted signal, whether or not the system has detected tampering. The determining may comprise comparing the transmitted signal to data stored in a database.

The method may further comprise reporting, responsive to determining that the system has not detected tampering, a first type of result. The method may comprise reporting, responsive to determining that the system has detected tampering, a second type of result. The first type of result may be a "pass" result and the second type of result may be a "fail" result.

The method may comprise receiving geo-location information indicating a location of the system. The geo-location may be approximate and may be received by another device, such as a mobile device associated with the system. The geo-location information may advantageously be received via any known geo-location technology, such as from a local mobile network (e.g. GSM) or via GPS. Such mobile network, GPS or similarly provided geo-location information is independently provided and is therefore harder to hack or falsify than geo-location information provided manually by individuals or by companies such as courier services.

The geo-location information may be gathered continuously or at regular intervals in order to provide tracking information for the system. The geo-location may advantageously be combined or reported alongside tamper-related information for the system to provide improved and increased information about the movement and security of a package at various stages during transit or on arrival of the system at a destination. If the system is paired with a single approved mobile device in the manner described above, then any geo-location information reported alongside tamper-related information will be highly reliable because it is coming from an approved device (non-approved devices attempting to send false geo-location information would not be able to simultaneously report tamper-related information, because they would not be able to access this tamper-related information).

The geo-location information indicating the location of the system may be compared to a database of locations to determine whether the system is in an allowable location. An allowable location may comprise a location stored in a list of allowable locations at the database or elsewhere. The geo-information may indicate that the system has been moved into or out of a particular country. The database of locations may comprise a list of countries and/or regions and allowable locations may comprise a subset of the list of countries and/or regions. An allowable location may comprise the system being inside or outside of a particular pre-determined country, region or geographical area.

More than one form of geo-location information for the system may be determined, and one or more of these multiple forms of geo-location can be compared to determine accuracy and veracity of the information. For example, a GPS-based geo-location information may be compared with geo-location determined from mobile network tower locations or triangulation.

The method may comprise reporting, responsive to determining that the system has not detected tampering and receiving geo-location information indicating that the location of the system is an allowable location, a first type of result.

The method may comprise reporting, responsive to determining that the system has detected tampering or receiving geo-location information indicating that the location of the system is an un-allowable location, a second type of result. The geo-location information may be received from a mobile network.

The first type of result may be a "pass" result. The second type of result may be a "fail" result. Reporting of the result may be to a user of a mobile device. The reporting may be by a server or the mobile device.

The signal indicative of whether or not the continuity sensor has detected a discontinuity in the detection means may be an encrypted signal. The first type of signal may comprise a first series of encrypted keys. The second type of signal may comprise a second series of encrypted keys. The method may comprise decrypting the series of keys in order to determine whether or not the system has detected tampering. Decryption may be performed by a mobile device associated with the system. Alternatively, decryption may be advantageously performed by a remote device or server, which improves security by ensuring that the decrypted message is harder to falsify or alter.

In accordance with a further aspect of the present disclosure, there is provided a security device comprising a container comprising walls defining an inner cavity. The container may comprise a detection means for detecting tampering. The detection means may be a conductive element such as a wire carrying a current in use. The detection means may be advantageously contained within the walls of the container, in order to provide structural rigidity and to conceal the detection means. For example, the detection means may be intermediate two layers of the walls of the container. The detection means may be arranged in a mesh or wave configuration and may be advantageously distributed throughout substantially all areas of the walls of the container so that substantially all walls of the container have tamper-detection functionality. Alternatively, the detection means may be distributed throughout a majority of the walls of the container, or throughout a portion of the walls of the container. The detection means may advantageously be distributed throughout the walls of the container such that a break in the walls of the container causes a discontinuity in the detection means. A break may comprise a tear, puncture, intrusion or other damage.

Accordingly, it will be appreciated that an improved system and method for securely transporting an item are provided. Tampering and/or damage to the container or package containing the item can be detected and reported and the location of the system comprising the container or package can be determined. Security and transparency can be improved by outsourcing generation of the geo-location information and/or decryption of signals relating to detection of tampering to a remote server or device not associated with the system or a person transporting the system.

BRIEF DESCRIPTION OF THE FIGURES

Exemplary arrangements of the disclosure shall now be described with reference to the drawings in which.

Throughout the description and the drawings, like reference numerals refer to like parts.

DETAILED DESCRIPTION

The following detailed description describes a number of exemplary implementations of the system to which the present disclosure relates, as well as to a number of exemplary methods and circumstances in which the system may be used.

A first implementation, relating to a single-use system will be described in relation to FIGS. 1-7. A second implementation, relating to a re-usable system will be described in relation to FIGS. 8*a* and 8*b*. It will be apparent that the features and considerations described in relation to the first implementation may be applied to and incorporated into the second implementation, even if not explicitly described in relation to the second implementation. Similarly, any features or considerations of the second implementation may be applied to and incorporated into the first implementation, even if not explicitly described in relation to the first implementation.

Figure 6:
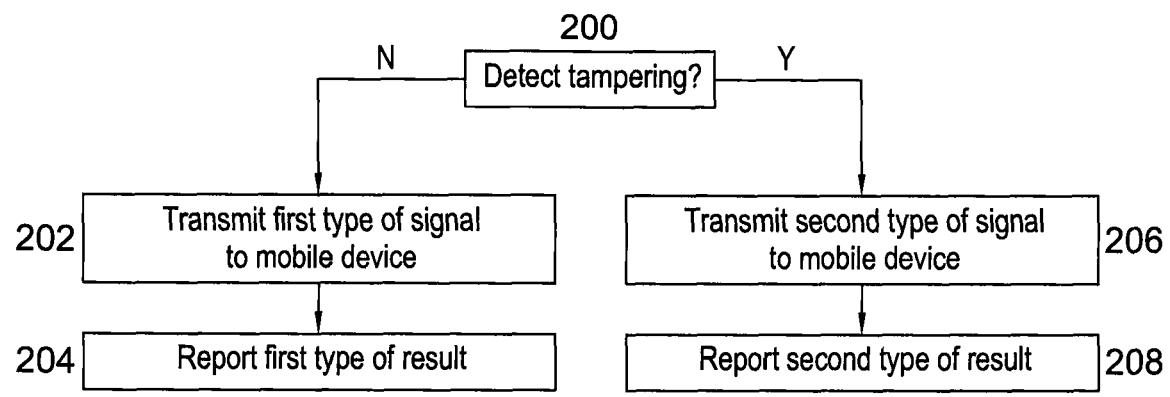
FIG. 6 shows a flow diagram depicting a method for detecting and reporting tampering with a system of the present disclosure.

Exemplary methods for using the system will be described in relation to FIGS. 6, 9 and 10. Exemplary implementations of the system in use will then be described in relation to FIGS. 11-13. It will be apparent that the order in which steps of these methods and implementations occur may change, depending on the requirements or preferences relevant to any particular implementation or situation. Not all of the steps of the described methods need to be followed in all implementations, and in some implementations various described steps may be left out altogether.

In an exemplary arrangement, the system to which the present disclosure relates comprises a container, such as a bag, box or packaging, which may be used to transport an item, such as a consumer good purchased at an online store or in an airport shop. Exemplary consumer goods include electronic devices, clothing, food and drink, household goods and such like. The system is configured to detect and report tampering with the system, if it occurs. Tampering may generally be considered to be any attempt to damage or open the container without authorisation or before the sender, owner or recipient of the container wishes the container to be opened. Tampering may also be considered to be any attempt to disable the tamper-detection mechanisms of the system. The system may therefore be considered as a tamper-proof system, a tamper-prevention system, a tamper-detection system or a safety system.

It will be apparent that such a system will have many potential uses, for example as an integral part of a secure courier service that may deliver goods to customers. The system may be used to prove that an item, such as a purchased good, placed and sealed inside the container has not been removed from the container during a period of time. This functionality can enable a courier to prove that they have delivered an item honestly and diligently, without attempting to remove, change, damage or otherwise tamper with the item. Alternatively, and as will be described in further detail in the following description, a purchaser of a good may place the good in the container of the system, seal the container and transport the system, with the good inside, to a new location, for example to a new country. The arrival of the system at a new location may be evidenced by geo-location information associated with the system, optionally received by a mobile device such as a smartphone that is in communication with or in proximity to the system. The purchaser can then prove to an authority, such as a customs regulator, that they have removed the purchased good from a particular country, thereby qualifying for a sales tax (e.g. VAT) refund.

Figure 1:
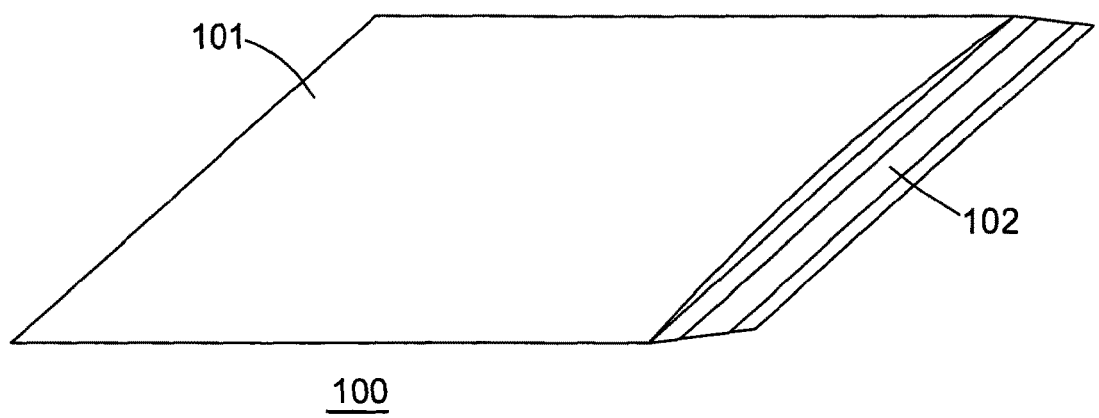
FIG. 1 shows an exemplary container of a system according to a first implementation.

Referring to FIG. 1, a container of a system according to a first implementation is shown. In this implementation the container comprises a bag 100, made of a durable material such as thick or reinforced plastic. The bag 100 is sealed along three edges and open along a fourth edge so that items can be placed inside the bag 100. The walls 101 of the bag 100 define a cavity, in other words the inner volume of the bag 100. The bag 100 comprises a sealing means. In this implementation the sealing means comprises an adhesive strip 102 on an end flap that can be folded over to seal the bag 100. The adhesive of the adhesive strip 102 is of sufficient strength to ensure that opening the bag 100 requires the bag 100 to be torn or cut open. Thus, in this implementation the bag 100 is sealable only once. It is therefore ensured that, once an item is sealed inside the bag 100, it can only be removed from the bag by tearing, cutting or otherwise compromising the structural integrity of the bag 100.

Figure 2:
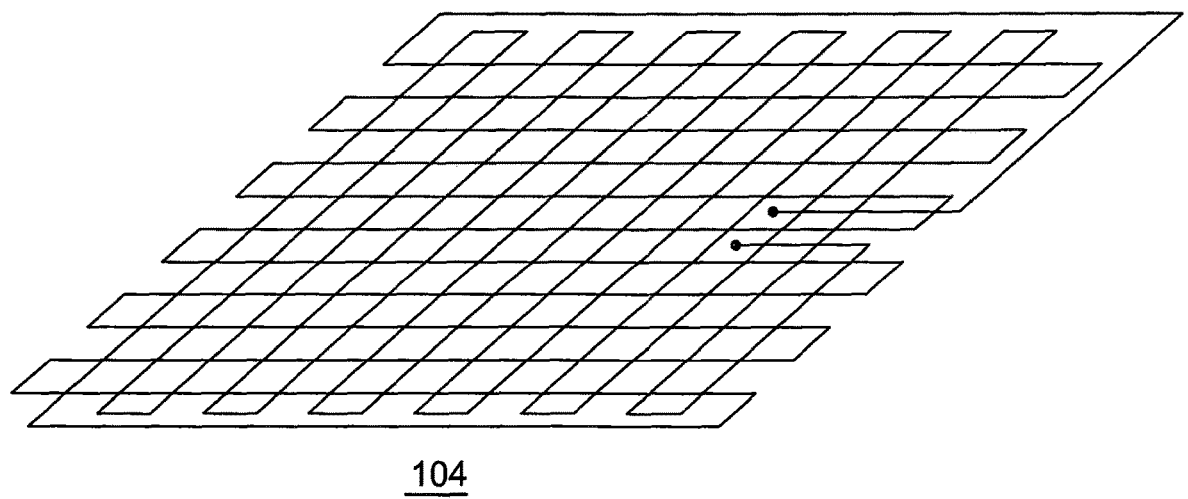
FIG. 2 shows an exemplary tamper detection means for use in the system.

FIG. 2 shows an exemplary detection means for detecting opening of the bag 100. The detection means in this implementation comprises a conductive element 104 arranged in a mesh configuration. In this implementation the conductive element 104 is a wire. Other conductive elements 104 that could be used will be apparent. When in normal operation, a current flows through the conductive element 104.

The conductive element 104 is affixed to the bag 100 and is sufficiently brittle or fragile such that any break or significant bending of the conductive element 104 will cause the current flowing through the conductive element 104 to change or stop flowing altogether. Therefore, opening, tearing or damaging the bag 100 will cause a discontinuity in the conductive element 104. If someone tears the bag 100 open (for example in order to gain access to or remove the item inside the bag 100), the conductive element will be broken at the location of the tear. When in normal operation, the current flowing through the conductive element 104 will therefore stop flowing. This change in current flow, or discontinuity, is detected by a continuity sensor 106, as will be described in relation to FIG. 5.

Figure 3:
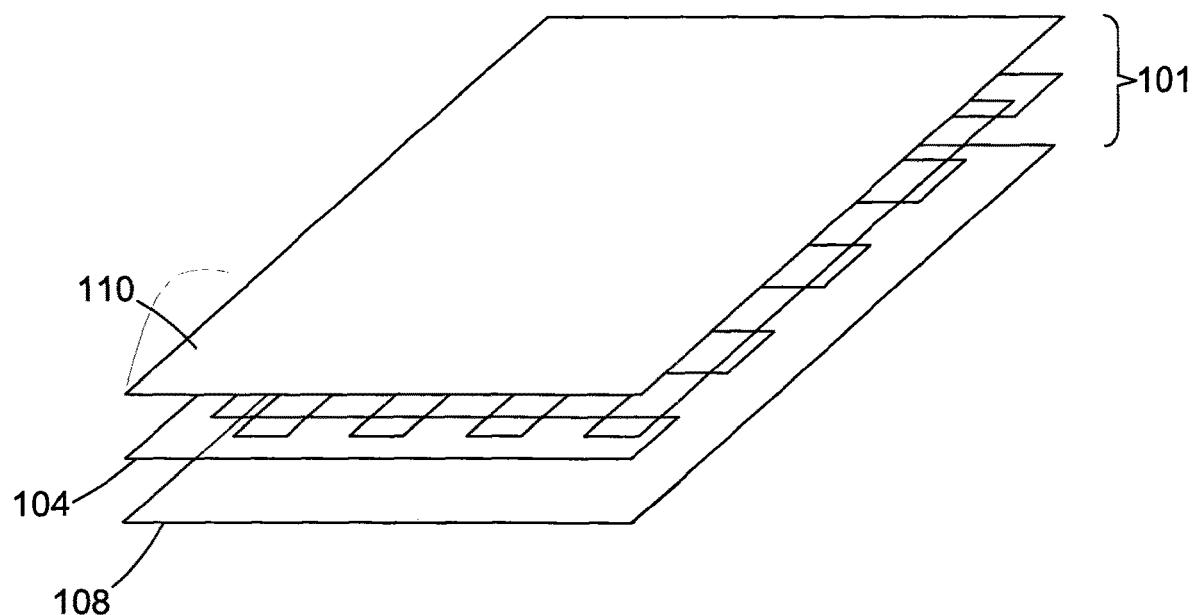
FIG. 3 shows an exploded view of a tamper detection means intermediate two layers of the walls of the system.

In this implementation, the conductive element 104 is contained within the walls 101 of the bag 100, as shown in FIG. 3. The conductive element 104 is therefore intermediate to (or "sandwiched" between) layers 108, 110 of the walls 101 of the bag 100. This arrangement provides rigidity and structural integrity to the bag 100 whilst also ensuring that any tearing of the walls 101 of the bag 100 will tear the conductive element 104 as well. If the outer layer 110 (or some number of sub-layers making up the outer layer 110) of the bag 100 is made from opaque material, such as coloured plastic, this arrangement also ensures that the conductive element 104 is hidden from view. This makes the bag 100 more secure, as potential intruders cannot tell that the bag 100 is secured with a tamper detection means or where the conductive elements are located.

In order to provide an effective system, the conductive element 104 must be arranged in such a way that no large sections of the bag's 100 walls 101 are not adhered to or in contact with a portion of the conductive element 104. In other words, all portions of the bag's 100 walls 101 should be connected to or in close proximity to a portion of the conductive element 104, in order to provide tamper-detection functionality throughout substantially the entire bag 100. The edges of the bag 100 should also be close to or adhered to portions of the conductive element 104, so that an attempt to open the bag 100 along an edge (for example by pulling two walls 101 of the bag 100 apart from one another) will still cause a discontinuity in the detection means.

Figure 4:
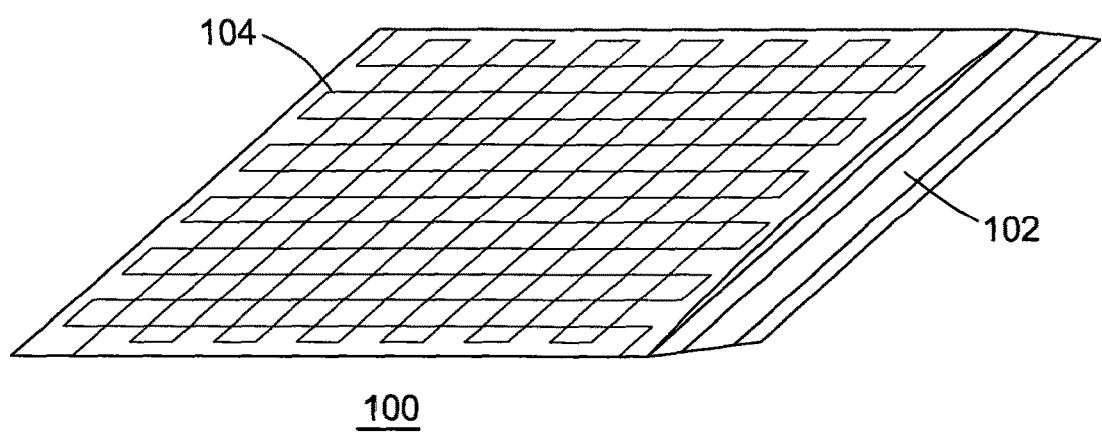
FIG. 4 shows a view of an exemplary arrangement of a tamper detection means wherein the tamper detection means is distributed throughout substantially all areas of the walls of the container of the system.

An exemplary arrangement of the conductive element 104 that meets these requirements is shown in FIG. 4, in which the outer layer 110 of the walls 101 of the bag 100 is not shown so that the conductive element 104 is visible. In this implementation, the conductive element 104 is arranged in a mesh and is distributed throughout substantially all areas of the bag's 100 walls 101. This ensures that the conductive element 104 is in contact with or in close proximity to enough of the surface of the walls 101 to ensure that any significant intrusion (e.g. tearing or ripping of the walls 101) results in a discontinuity (e.g. bend or tear) of the conductive element 104. A substantial intrusion in this context and in this implementation comprises a tearing or ripping that is large enough that it may enable an intruder to access the internal cavity of the bag 100 (and therefore the item stored inside the bag 100). In this implementation, the gaps between the overlapping sections of the conductive element 104 are of the order of millimetres, however in other contexts and in other implementations, a substantial intrusion may be defined in other ways, and so the distance between portions of the conductive element 104 may be larger or smaller. It will be apparent that in some contexts it may be advantageous for the conductive element to be so sensitive that a discontinuity occurs even before the walls 101 of the bag 100 are torn or cut. For example, a container that is to be used for transporting fragile goods may comprise a highly sensitive conductive element 104, such that excessive force or maltreatment of the package causes a discontinuity. In other contexts, the opposite may be true and a less sensitive or more robust conductive element 104 may be used, optionally in combination with a more robust material for the container walls 101. Such arrangements may be suitable for carrying larger or less fragile items. In such arrangements it may be acceptable for the spacing between portions of the conductive element 104 to be quite large.

Figure 5:
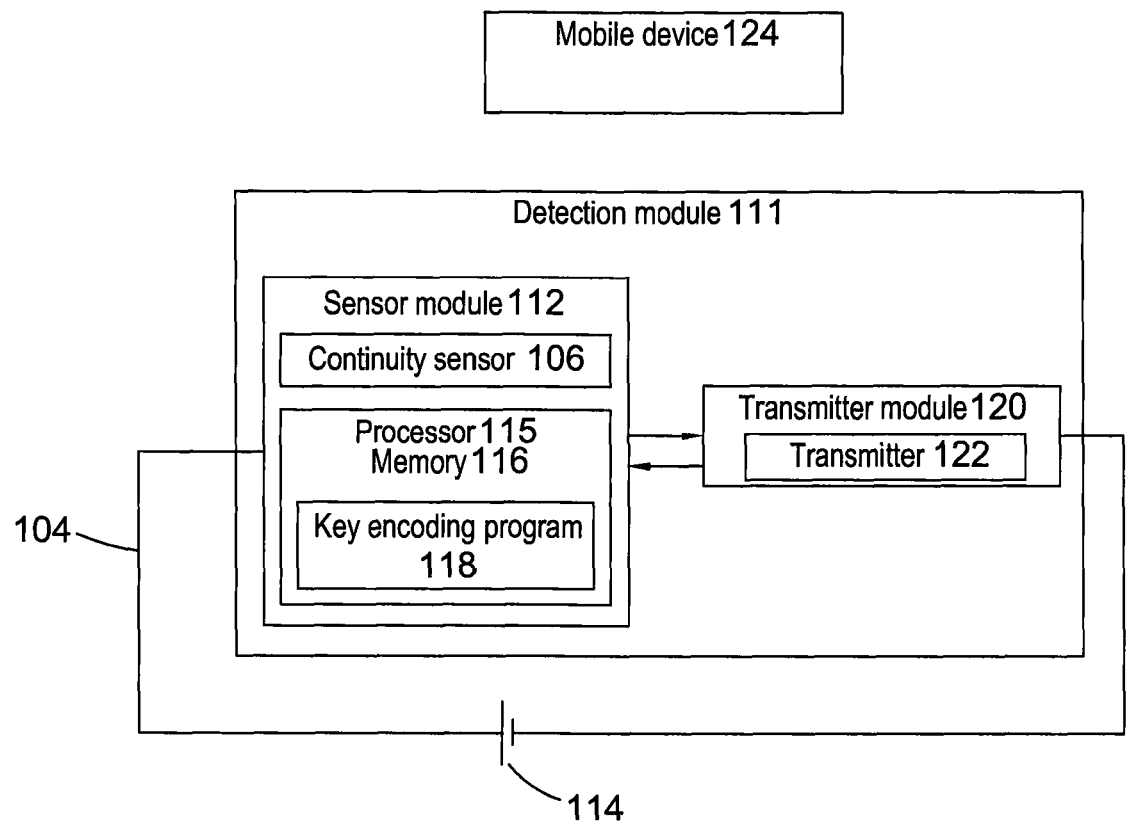
FIG. 5 shows a schematic arrangement of a detection module comprising an electronic sensor module and a transmitter module configured to detect tampering and transmit signals responsive to the detection respectively.

Turning now to FIG. 5, a detection module 111 for use in this implementation is shown. The detection module 111 houses an electronic sensor module 112 and a transmitter module 120. The detection module 111 (and therefore the electronic sensor module 112 and transmitter module 120) is connected to the conductive element 104 such that the modules 111, 112, 120 form part of a circuit comprising the conductive element 104 and current source 114. In use, current flows through the electronic sensor module 112 and transmitter module 120 and provides power to the respective components therein. The circuit is here shown schematically as a series circuit for simplicity, but it will be appreciated that the system is configured such that the detection module 111 still receives power even if the conductive element 104 is severed, for example due to tampering. Thus, in reality the circuit is preferably a parallel circuit. Advantageously, conductive element 104 is provided around (for example above and below and/or at either side of) detection module 111 to prevent removal of or tampering with detection module 111 or elements thereof.

Electronic sensor module 112 comprises the continuity sensor 106 described previously, which is configured to monitor the current flowing through the conductive element 104. In this implementation the continuity sensor 106 monitors the absolute value of current flowing through conductive element 104. Other means of monitoring the current will be apparent. For example, the continuity sensor 106 may detect or monitor changes in current, absolute voltage, changes in voltage, absolute resistivity, changes in resistivity or some other parameter, for example temperature. Furthermore, continuity of the circuit can be measured on more than one channel. In some arrangements, the sensor can measure several circuits at once if desired or necessary.

In this implementation the electronic sensor module 112 further comprises a processor 115 and memory 116 operable to run a digital key encoding program 118. During operation this program 118 generates a series of encrypted digital keys. When the continuity sensor 106 does not detect any discontinuity (in other words when no tampering has occurred) the key encryption program 118 is configured to generate a first series of encrypted keys, for example "Series A". If the continuity sensor 106 detects a discontinuity (e.g. as a result of tampering), the key encryption program 118 is configured to generate a second series of encrypted keys, for example "Series B". Using series of encrypted digital keys is more secure than generating un-encrypted messages indicative of tampering. Encrypted keys must be decrypted, and the ability to decrypt the keys can be limited to devices that are provided with the appropriate decryption means, such as a database of keys. This reduces the ability of malicious hackers to alter or falsify indications of tampering (or lack thereof). In some implementations, however, un-encrypted signals may be used.

The electronic sensor module 112 is in communication with the transmitter module 120. The transmitter module 120 is configured, in use, to transmit the encrypted keys generated by the key encoding program 118. In other words, during normal operation when no tampering is detected, a transmitter 122 of the transmitter module 120 transmits generated Series A keys. If tampering occurs and a discontinuity is detected by the continuity sensor 106, the key encoding program 118 generates Series B keys and therefore the transmitter 122 of the transmitter module 120 begins to transmit generated key Series B.

In this implementation, transmission of the generated series of keys (A or B) is continuous. In other words, the transmitter 122 continuously emits either Series A or B keys, depending on whether or not tampering has been detected. This has the advantage that the status of the system (e.g. the integrity of the bag 100) can be monitored continuously and at any time, by receiving the transmitted signal. "Continuous" transmission by the transmitter 122 is herein to be interpreted broadly as meaning simply that the transmitter transmits at regular or irregular intervals over an extended period of time, and the transmitted signals are available to be received by an appropriate device at any time or within a particular time window.

The transmitter 122 continuously transmits signals until either an instruction is received to stop transmitting signals, or a pre-determined period of time elapses. The instruction for the transmitter to stop transmitting signals can be received from processor 115 and memory 116. Alternatively the instruction may come from a mobile device, optionally an approved mobile device such as a mobile device that is paired with the system. The instruction may be sent once an approved transaction has been completed. In alternative arrangements, the transmitter 122 continuously transmits signals until current source 114 no longer provides power to the transmitter module 120.

In this implementation the encrypted keys are transmitted by the transmitter 122 via a low-energy Bluetooth signal. The transmitted signal may therefore be received by any device within range and operable to receive Bluetooth signals of this type. In the implementation shown in FIG. 5, the transmitted signals are received by a receiver of a Bluetooth enabled mobile device 124, such as a smartphone. It will be apparent that a variety of devices may be used, and signal types other than Bluetooth may be utilised.

In this implementation, in order to receive the transmitted signals from the system (via the transmitter 122), the mobile device 124 is paired with the system prior to use. More specifically, in this implementation, once associated or paired with an ID of the system, an application running on the mobile device 124 enables the mobile device 124 to form a communication link with the transmitter 122 of the system and receive the transmitted series of encrypted keys from the transmitter 122. Unpaired or un-associated devices do not receive signals from the system in this implementation. This reduces processing and bandwidth requirements as devices do not receive signals from systems with which they are not paired. In other implementations, however, this restriction may not be used and the transmitter 122 may transmit the signals to any device that is within range.

It will be appreciated that, by using the disclosed system and transmitting signals responsive to the status of the system (e.g. the tamper-detection status of the continuity sensor 106 and integrity of the bag 100) to a mobile device 124 in the manner described above, the transmitted signals can be decrypted and an indication of whether or not the system has detected tampering can be provided. This process is shown in FIG. 6.

At step 200, the system either detects or does not detect tampering (depending on whether the continuity sensor 106 detects a discontinuity in the conductive element 104 or not). If the system does not detect tampering (i.e. the continuity sensor 106 does not detect a discontinuity), the transmitter 122 transmits at step 202 a first type of signal (in this implementation encrypted key Series A) to paired mobile device 124. Once this signal has been interpreted, a first type of result (such as "no tamper detected" or "pass") is reported by the mobile device, at step 204. If the system detects tampering (i.e. the continuity sensor 106 detects a discontinuity), the transmitter 122 transmits at step 206 a second type of signal (in this implementation encrypted keys Series B) to paired mobile device 124. Once this signal has been interpreted, a second type of result (such as "tamper detected" or "fail") is reported by the mobile device 124, at step 208.

In order for reports (such as those at step 204 and 208) to be provided, the transmitted encrypted keys must be decrypted in order to determine which series they belong to and thus whether or not they are indicative of tamper detection or not. In some implementations, the mobile device 124 may store a database 126 locally, which can be used to decrypt the encrypted keys, or against which the received series of encrypted keys can be compared. The database 126 enables the mobile device 124 to determine whether the received series of keys indicates that the system has detected tampering or not. The mobile device 124 can then provide a status indicator to a user of the mobile device 124 (or to another user, for example by sending the status indicator in a text message or email) showing whether or not the system has detected tampering, as described in relation to FIG. 6.

Storing the database 126 locally on the mobile device 124 in this way may however leave the system vulnerable to hacking or manipulation, because the owner of the mobile device 124 may be able to manipulate the database 126 to cause the mobile device 124 to report a false status indicator (for example a "pass" indicator even though the system has detected tampering and transmitted key Series B). Therefore, in the present implementation, the database 126 is not stored locally at the mobile device 124 but is instead stored at a remote server 128. In this implementation, upon receiving the transmitted series of encrypted keys from the transmitter 122 of the system, the mobile device 124 sends the signal on to the remote server 128. The remote server 128 then decrypts the encrypted keys by comparing the signal (i.e. the series of encrypted keys) to a database 126 stored at the remote server. The remote server 128 can then independently provide a status indicator indicating whether or not the system has detected tampering. This status indicator may be sent back to the mobile device 124 for presenting to the user, or to an independent authority such as a customs regulator. In this way, the status indicator is produced independently of the courier or person transporting the system, which reduces the ability for that person to alter the status indicator for their own advantage. The system is therefore made more secure and trustworthy. It will be apparent that in some circumstances (for example in small scale/low value operations or where levels of trust are high) this added level of security may not always be necessary, and the database 126 may be stored locally at the mobile device 124 as described previously.

Figure 7:
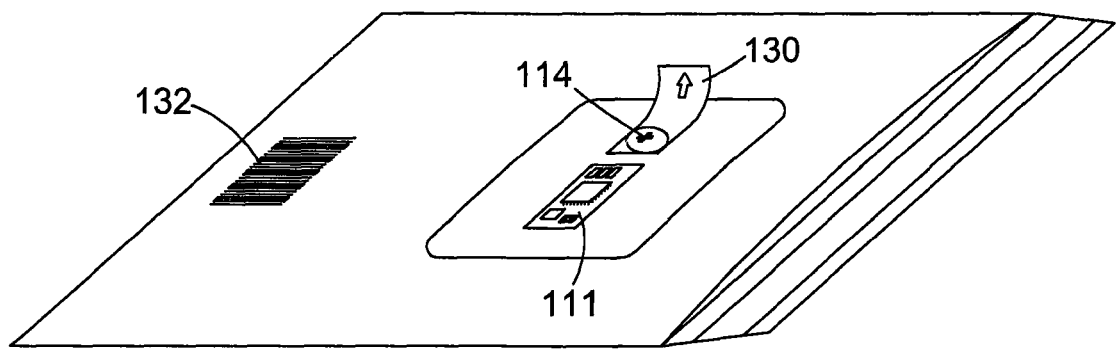
FIG. 7 shows an arrangement wherein a system according to the first implementation comprises a detection module such as that shown schematically in FIG. 5, a power source and an identification tag.

Turning now to FIG. 7, the system of the first implementation is shown, with the detection module 111 comprising electronic sensor module 112 and transmitter module 120 visible and adhered to the bag 100 of FIG. 1. Also visible is the current source 114, in this case a coin-cell battery. Before the system is operational, the current source 114 is isolated from the conductive element 104 by an isolator strip 130, so that current does not flow and the current source 114 does not lose power. When the system is to be used, the isolator strip 130 is removed and current flows through conductive element 104. Electronic sensor module 112 and transmitter module 120 then become operational.

FIG. 7 also shows the bag 100 comprising a unique identifier 132, in this case a barcode. This allows the system to be associated with a mobile device 124 in the manner described previously. A list of unique identifiers 132 of systems and the mobile devices 124 with which they are associated may be stored by the remote server 128 or at another location so that association between individuals, systems and mobile devices 124 can be recorded and tracked.

The association with a mobile device allows the system to be configured with the merchant or other transaction control as it fits in with existing inventory systems. In practice, the main means of association between the security bag of the disclosure and the mobile device will be through a Bluetooth connection, although other means that may be used will be apparent.

In this implementation, the detection module 111 (and therefore electronic sensor module 112 and transmitter module 120) and current source 114 are adhered to the bag 100 and are part of the circuit completing conductive element 104, such that an attempt to remove any of these components respectively will cause a discontinuity in the conductive element 104. This prevents a nefarious party from trying to avoid detection by removing the electronic sensor module 112, transmitter module 120 or power source 114.

A first implementation of a system for detecting tampering has been described. It will be apparent that not all possible arrangements of the disclosed features have been described. Some of the described features of the first implementation may be omitted or combined in isolation of other described features.

A second implementation of a system for detecting tampering will now be described with reference to FIGS. 8a and 8b. Other than the differences that will be described, the system of the second implementation shown shares all of the features of the system of the first implementation, described with reference to FIGS. 1-7.

The security bag 300 of the system of the second implementation can be sealed more than once. That is, rather than comprising an adhesive strip 102, the bag 300 of the second implementation comprises a re-sealable closing mechanism. In the arrangement shown in FIG. 8a, the bag 300 is sealable by a set of fastening buttons 302. When the sealing flap is folded down to seal the bag 300, the buttons 302 on the flap fasten to the buttons 302 on the walls 101 of the bag 300.

Figure 8A:
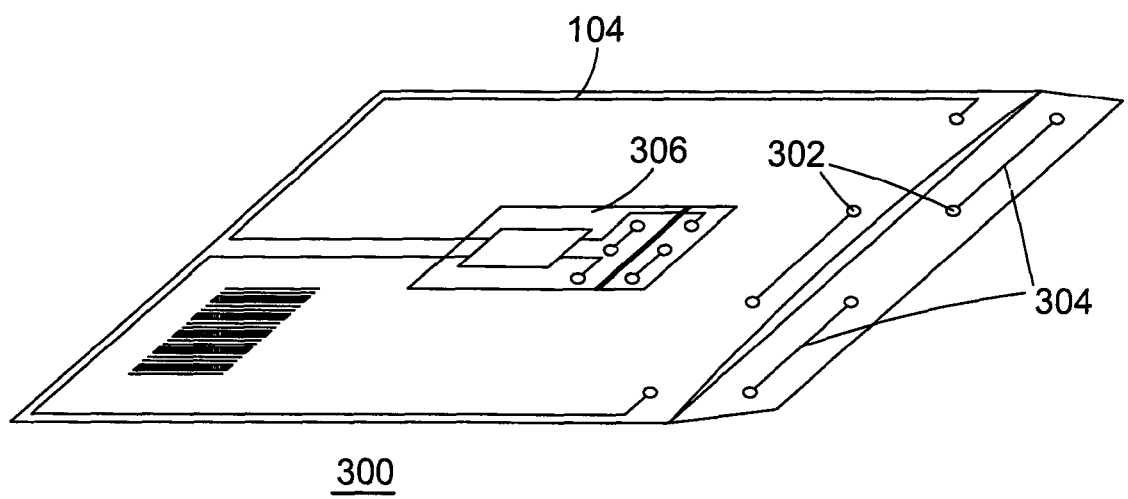
FIG. 8*a* shows an exemplary system according to a second implementation wherein the system is re-usable and can be sealed more than once.

The fastening buttons 302 are conductive and are connected to one another by conductive strips 304, as shown in FIG. 8a. The conductive element 104 of the bag 300 in the second implementation is not a complete circuit when the bag 300 is open. However, when the bag is sealed, the fastening buttons 302 and the conductive strips 304 complete the circuit of the conductive element 104 of the bag 300, assuming that there are no other discontinuities or breaks in the circuit. The conductive element 104 then works as a tamper detection means in the same way as described in reference to the first implementation. The mesh section of the conductive element 104 (not shown in FIG. 8a) is distributed throughout the bag 300 in the same way as in the first implementation. Therefore, the current flowing through conductive element 104 will be broken if either: i) an attempt is made to damage, rip or tear open the walls of the bag 300 or ii) the seal is opened, separating the conductive fastening buttons 302 and breaking the circuit of the detection means.

Once an item stored in the bag 300 has been delivered, and assuming no tampering has occurred, a pass (or "no tamper detected") result can been generated in the same way as described in relation to the first implementation. The bag 300 can then be opened and the item removed as required. An instruction is provided at this stage for the transmitter 122 to stop transmitting signals, in order to save power and to provide protection against hacking of the system in an attempt to re-use it without authorisation.

In the second implementation, opening the bag 300 does not destroy the bag 300 because the fastening buttons 302 can be unfastened without damaging them or the bag. Therefore, the bag 300 of the second implementation can be re-used multiple times. The electronic sensor module 112 and transmitter module 120 should be reset after authorised removal of the item stored in the bag 300, so that the bag 300 is ready for re-use. Resetting may be performed by the recipient or owner of the system. Alternatively, the system, including the bag 300, may be returned to a central authority such as a customs regulator or courier service for re-setting.

In some instances, re-setting the electronic sensor module 112 and transmitter module 120 may require the modules 112, 120 to be removed from the bag 300. In some cases, the current source 114 may also need to be replaced, for example if the current source 114 is a battery with a limited power lifetime. An indication of the remaining power of the current source 114 may be displayed, enabling a serviceperson to determine whether or not the current source 114 needs to be replaced or recharged.

In order to take into account these requirements, the bag 300 in the second implementation comprises an access pouch 306. Rather than being adhered to the bag 300, as in the first implementation, the electronic sensor module 112, transmitter module 120 and current source 114 are stored in the access pouch 306. The access pouch 306 is sealed in the same way as the seal of the main bag 300 is sealed, by fastening conductive fastening buttons 302. In the same way as for the bag 300, the conductive element 104 is a complete circuit when the access pouch 306 is sealed (assuming the opening of the bag 300 itself is also sealed and there are no other discontinuities in the circuit), but the circuit is broken (and thus a discontinuity will be detected by the continuity sensor 106) once the access pouch 306 is opened. This arrangement ensures that unauthorised attempts to remove the electronic sensor module 112, transmitter module 120 or current source 114 will be detected. However, it also allows an authorised person to remove the sensor 112 and/or transmitter 120 module to reset them for re-use, or to recharge or replace the current source 114. For added security, in this implementation the access pouch 306 is only accessible from inside the cavity of the bag 300.

The re-usable bag 300 of the second implementation may advantageously be made of sturdy and/or environmentally friendly material, such as cloth. If a cloth (or similar) bag 300 is used, the bag's 300 walls may be sewn together (rather than being fused, as is typical for plastic bags). In the case of a sewn bag, a portion of the conductive element 104 can be included in the seam of the cloth bag 300, as shown in FIG. 8a, so that attempting to tear or cut at the seam of the bag will still cause a discontinuity and will therefore be detected.

Figure 8B:
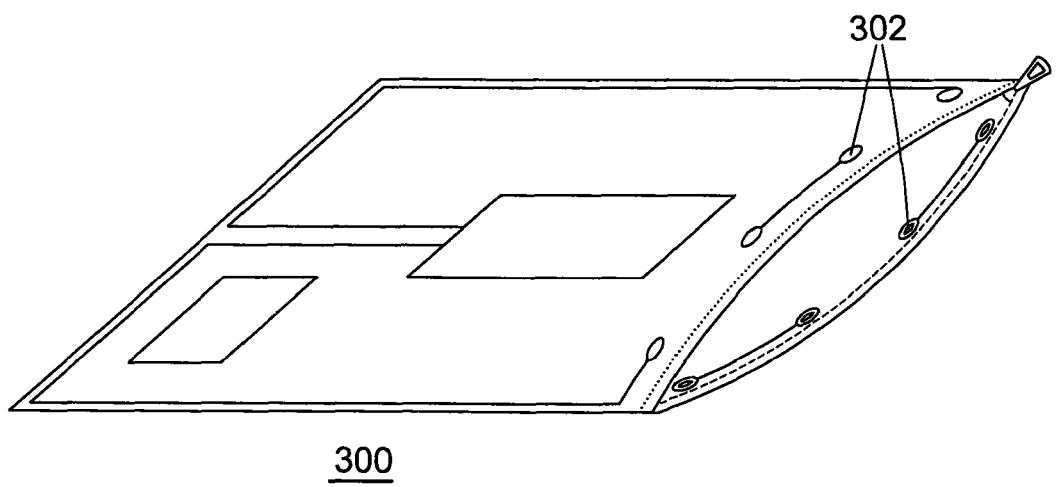
FIG. 8*b* shows an alternative version of a re-useable system according to the second implementation.

FIG. 8b shows an alternative system according to the second implementation. As a means of protecting the conductive snaps or buttons 302 from being opened inadvertently, it may be preferred to arrange the buttons 302 inside the bag 300 with the opening of the bag 300 closed by a zip or Velcro®, or similar mechanism for permitting opening and then re-sealing.

The key features of a system for detecting tampering have been described according to first and second implementations. Exemplary methods by which the systems of either the first or second implementation may be utilised will now be set forth with reference to FIGS. 9 and 10.

Figure 9:
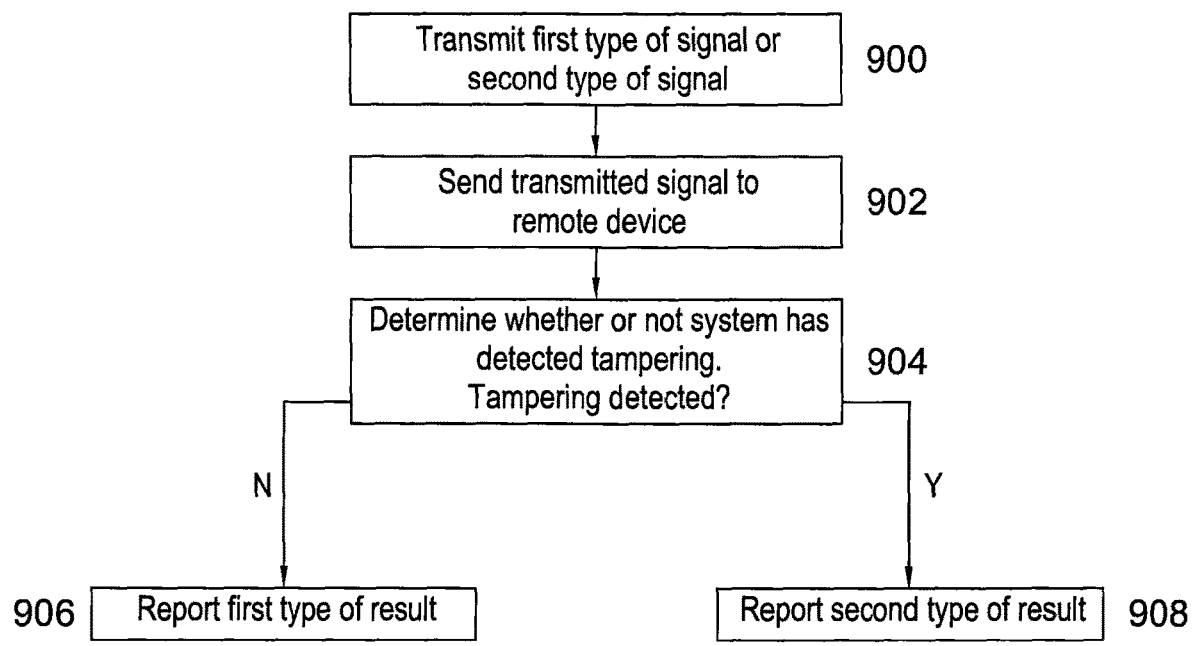
FIG. 9 shows a flow diagram of a method for determining and reporting tampering with a system of the present disclosure.

FIG. 9 shows a flow diagram of a method for using a system according to the present disclosure for secure transport of an item.

At step 900, the system transmits (via transmitter 122) either a first type of signal or a second type of signal, depending on whether or not the system has detected (via conductive element 104 and continuity sensor 106) tampering. At step 902, the signal transmitted by the system is sent to a remote device, such as remote server 128. At step 904, the remote device determines whether or not the system has detected tampering. This determining may comprise decrypting the signal transmitted by the system and/or comparing the signal to data stored in a database 126.

If it is determined at step 904 that tampering has not been detected, a first type of result (e.g. "pass") is reported at step 906. If it is determined at step 904 that tampering has been detected, a second type of result (e.g. "fail") is reported at step 908.

Figure 10:
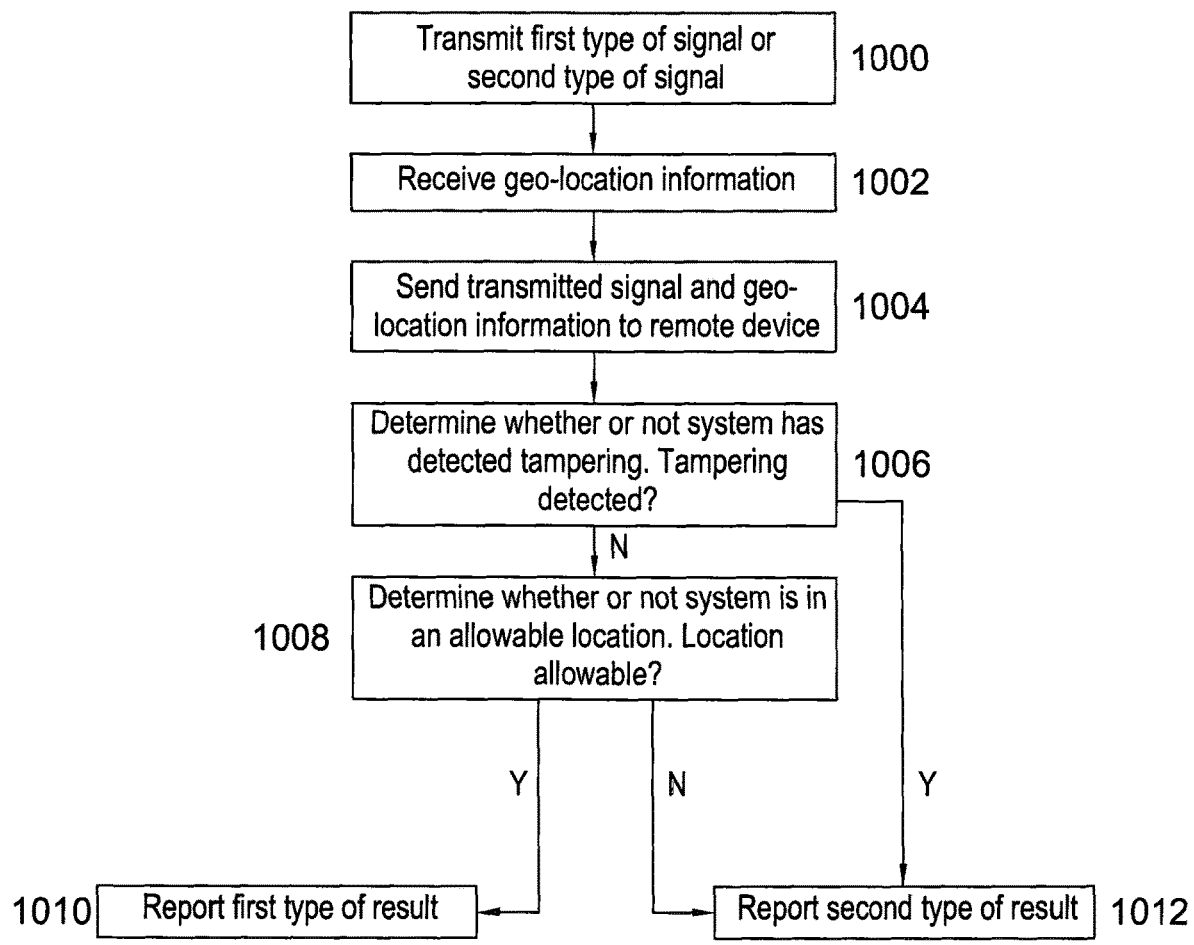
FIG. 10 shows a flow diagram of a method for determining and reporting tampering with and a location of a system of the present disclosure.
Figure 11:
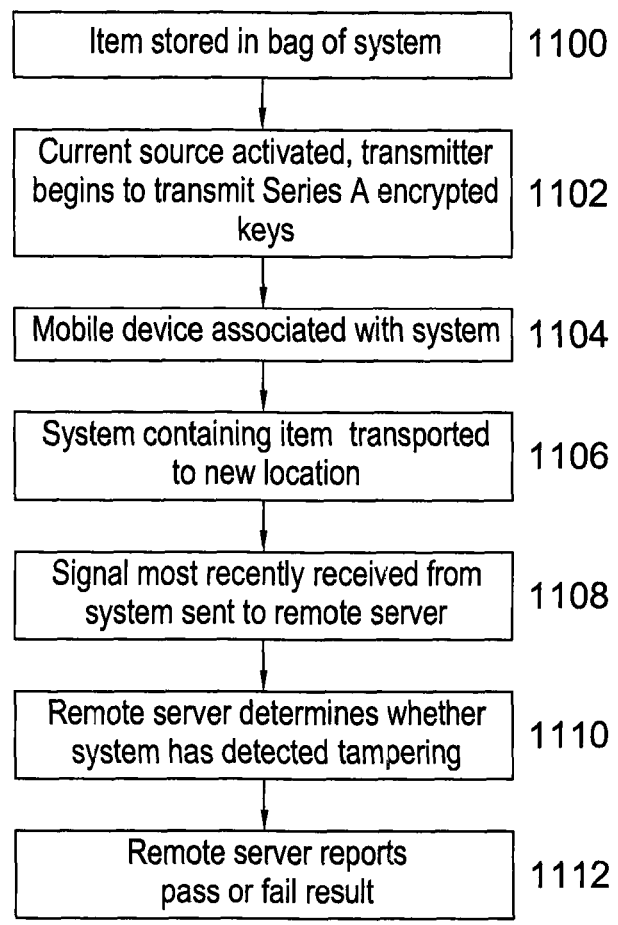
FIG. 11 shows a flow diagram of a first exemplary implementation of the system of the present disclosure in use.

FIG. 10 shows a flow diagram of another method for using a system according to the present disclosure for secure transport of an item.

At step 1000, the system transmits (via transmitter 122) either a first type of signal or a second type of signal, depending on whether or not the system has detected (via conductive element 104 and continuity sensor 106) tampering. At step 1002, geo-location information is received, for example from a mobile network, e.g. a mobile phone network or a GPS signal, indicating the location of the system.

At step 1004, the signal transmitted by the system and the geo-location information indicating the location of the system is sent to a remote device, such as remote server 128. At step 1006, the remote device determines whether or not the system has detected tampering. This determining may comprise comparing the signal transmitted by the system to data stored in a database 126.

If it is determined at step 1006 that tampering has not been detected, the remote device determines at step 1008 whether or not the system is in an allowable location. An allowable location may comprise being located inside or outside of a particular country, region or area. If it is determined at step 1008 that the system is in an allowable location, a first type of result (e.g. "pass") is reported at step 1010.

If it is determined at step 1006 that tampering has been detected or if it is determined at step 1008 that the system is in an un-allowable location, a second type of result (e.g. "fail") is reported at step 1012.

The above described methods are two illustrative methods by which the system of the present disclosure can be used to provide more secure transport of items. It will be apparent that the method steps described in relation to FIGS. 9 and 10 may be performed by a variety of devices, and the specific devices described herein are not intended to be limiting. For example, the signals transmitted by the system at steps 900 and 1000 and the geo-location information provided at step 1002 respectively may be transmitted to any device operable to receive such signals. In some implementations, the receiving device may be a mobile device such as a smartphone. The sending of the signal to a remote device at steps and 902 and 1004 may also be by any device capable of sending such signals. The sending may be by the same device as initially received the signals from the system, but this need not be the case—in other words, there may be intermediary devices. The step of sending the data to a remote device may be omitted entirely if this added layer of security is deemed to be unnecessary. The determining at steps 904, 1006 and 1008 may be by any device capable of analysing and/or decrypting the signal received from the system. The reporting at steps 906, 908, 1010 and 1012 respectively may similarly be by any device capable of providing such reports.

Now that methods for using the system of the present disclosure have been described at a high level, more specific examples of how the system may be used in various circumstances will be given. These examples are merely intended to illustrate the advantages provided by the disclosed systems and methods, and are therefore not to be read as limiting the scope of the disclosure to the specific implementations and circumstances described therein.

Example 1: Courier Service

In a first example, the system of either the first or second implementation may be used by a courier transporting an item. This example will be described with reference to FIG. 11.

The process in this example begins when a purchaser purchases an item, for example at an online marketplace. The item is prepared for dispatch by being placed within the system of the present disclosure at step 1100. In other words, the item is placed in a container such as the bag 100, 300 of the first or second implementations. The bag 100, 300 is then sealed and the current source 114 activated. As there should be no discontinuities in the conductive element 104 at the beginning of the process, the transmitter begins to transmit encrypted key Series A at step 1102.

A mobile device 124, such as a smartphone, is then associated with the system at step 1104. In this example, association is achieved by scanning the ID 132 of the bag 100, 300 with a barcode scanner or with the camera of the mobile device 124. In this example, once scanned, association between the unique bag 100, 300 is registered by an application running on the mobile device 124. The application causes the mobile device 124 to send a notification of association to a remote server 128 owned by the courier company. The notification identifies the courier who will be delivering the package. This provides security and accountability. The association between the system, item, purchaser and courier is also stored at remote server 128.

The bag 100, 300 with the purchased item inside is then transported by the courier to a new location at step 1106. Upon arrival, the courier presents the package to the recipient. The courier also opens the application running on his mobile device 124. As the mobile device 124 is associated with the system, the mobile device 124 receives a signal (either Series A or Series B keys) from the transmitter 122 of the system. This signal represents the most recently received signal from the system and is sent to a remote server 128 at step 1108.

By comparing the received signal to a database 126, the remote server 128 can decrypt at step 1110 the signal to determine which series of encrypted keys (A or B) the system is transmitting. The remote server 128 can therefore determine whether or not the continuity sensor 106 of the system has detected a discontinuity. The remote server 128 sends an indication at step 1112 to the mobile device 124 either reporting a pass or fail result, depending on whether or not the decrypted signal indicated that a discontinuity had been detected. Assuming the system has not been damaged or tampered with during transit, the remote server 128 will have received Series A keys and therefore sends a pass result to the mobile device 124. The remote server 128 also generates an instruction, relayed by the mobile device 124 to the system, for the system to stop transmitting signals in order to save power and prevent re-use through hacking of the detection module 111.

The received pass notification can then be shown to the recipient of the package as evidence that their package has not been tampered with or maltreated during transit. The result may also be logged by the courier service as an indication that the courier who transported the item has safely delivered the package, for example to the desired location.

Furthermore, as the mobile device 124 is associated with the system and has been within range of the Bluetooth signals being transmitted by the transmitter 122 of the system throughout transit, the mobile device 124 has continuously been receiving either Series A or Series B signals from the system during transit. The mobile device 124 has also been continuously receiving geo-location information indicating the location of the system. The received signals (A or B keys) and geo-location information has been continuously being sent to and stored by the remote server 128. The courier or courier service can therefore access the remote server 128 and provide detailed information about the various locations of the system throughout transit. Importantly, assuming no tampering or damage has occurred, the server 128 will have received Series A keys at every stage of the transit of the system. The courier or courier service can therefore provide detailed tracking information comprising evidence that no tampering occurred at any point during transit. It will be apparent that not all implementations will require geo-location or tracking information, and so in some implementations only a single, final tamper-detection status indication is provided.

If the package has been damaged or tampered with at any point during transit, the damage or tampering will have been detected by the conductive element 104 and continuity sensor 106 of the system. The system will therefore transmit Series B encrypted keys to mobile device 124. Upon receiving this signal from mobile device 124, the remote server 128 will determine that tampering has occurred and will therefore report a fail result to the mobile device 124 and/or courier service. The purchaser may decide to reject the package as a result of this, and the courier service may take action to determine why tampering or damage occurred during transit.

In this example, the transmitter 122 is also configured to transmit the second type of signal (Series B keys) after a pre-determined period of time has elapsed. This advantageously forces the courier to deliver the package before that time, which in turn provides improved security and safety by ensuring that the goods inside the container 100 are delivered within a particular time window. As will be apparent, this has clear advantages when the goods are, for example, perishable or of high value and must be delivered quickly. The fixed expiry time can also be made to correspond with a previously agreed delivery time window, again improving security and certainty for the recipient of the package. The courier is also prevented from simply waiting wait until the power source runs out before tampering with the system.

It can therefore be seen that the disclosed system enables more informative and secure transport of a package, for example by a courier service.

A second example will now be given which shows how the disclosed system can be used to determine whether or not the system of the present disclosure still contains a particular item and is in an allowable location. This example will be described with reference to FIG. 12.

Example 2: Sales Tax (e.g. VAT) Refund

In a second example, a purchaser has purchased an item in a country which they are leaving. Upon leaving the country, the purchaser wishes to apply for a VAT refund on the item they purchased. As in the first example, the item is placed inside the bag 100, 300 at step 1200 and the system is activated at step 1202, causing the transmitter 122 to begin transmitting Series A keys. The mobile device 124 belonging to the purchaser is associated with the system at step 1204 via an application running on the purchaser's mobile device 124. The association between the seller, system, item and purchaser is stored at remote server 128.

The purchaser then takes the item, sealed in the bag 100, 300, back to their home country at step 1206. Upon arriving in their home country, the purchaser opens the application running on their mobile device 124. The mobile device 124 receives series of encrypted keys from the transmitter 122 of the system. In this example, the mobile device 124 also receives geo-location information from the local mobile network 134 to determine the mobile device's 124 location at the time it received the signal from the system. The time at which the signal was received from the system and the geo-location was received from the network 134 is verified by a time stamp. As the mobile device 124 is in Bluetooth communication with the system and Bluetooth signals have a range of around 100 m, the location of the mobile device 124 will be approximately equal to (or less than approximately 100 m away from) the location of the system.

As in the first example, the mobile device 124 sends the most recently received set of encrypted keys to a remote server 128 for comparison with a database 126 at step 1208, in order that the remote server 128 can determine at step 1212 whether or not the system has been tampered with or damaged. The mobile device 124 also sends at step 1210 the geo-location information indicating the system's (approximate) location. The concurrence of the signal received from the system and the geo-location information can be verified by the time stamp of each. The remote server 128 can therefore compare the geo-location information to a database of approved or allowable locations, in order to determine at step 1214 whether or not the system is in an allowable location. In this context, an allowable location comprises a location outside of the country where the item was originally purchased.

If the purchaser has left the item in the bag 100, 300 and not damaged the system, the signal received from the transmitter 122 of the system will comprise Series A keys and the remote server 128 will therefore confirm at step 1212 that no tampering has been detected. If the purchaser has also left the country where they purchased the item and taken the system (and therefore the item sealed in the bag 100, 300 of the system) with them, the remote server 128 will confirm this at step 1214 from the geo-location information. The remote server 128 will then send to the mobile device 124 at step 1216 an instruction to disable the detection module 111 along with a pass notification, because the purchaser has provided evidence that: i) the bag 100, 300 has not been opened, indicating that the item is still sealed in the bag 100, 300 and ii) the bag 100, 300 containing the item has been taken out of the country where the item was purchased. The pass result can then be reported both to the purchaser, the seller and the customs agency and a suitable refund or receipt (for example a VAT refund) can be issued.

A fail result will be generated, and therefore no refund will be given, if either: i) the signal received from the system indicates that the bag 100, 300 has been opened since the time of purchase or ii) the geo-location information shows that the bag 100, 300 has not been taken out of the country where the item was purchased.

In this example, the transmitter 122 is also configured to transmit the second type of signal (Series B keys) after a pre-determined period of time has elapsed. This advantageously provides a defined expiry date by which the signal transmitted by the system and the geo-location information must be sent to the remote server 128. The defined expiry date can be adjusted as required, for example to comply with export regulations that require items to be removed from the country of purchase within three months in order to qualify for a VAT refund.

Figure 12:
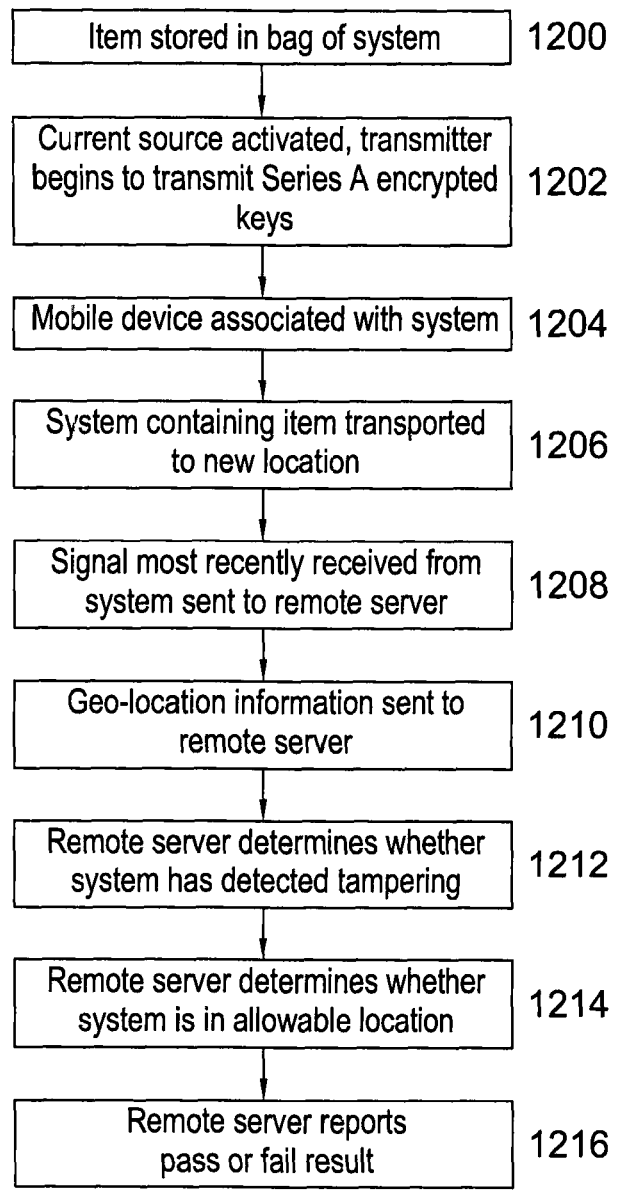
FIG. 12 shows a flow diagram of a second exemplary implementation of the system of the present disclosure in use.
Figure 13:
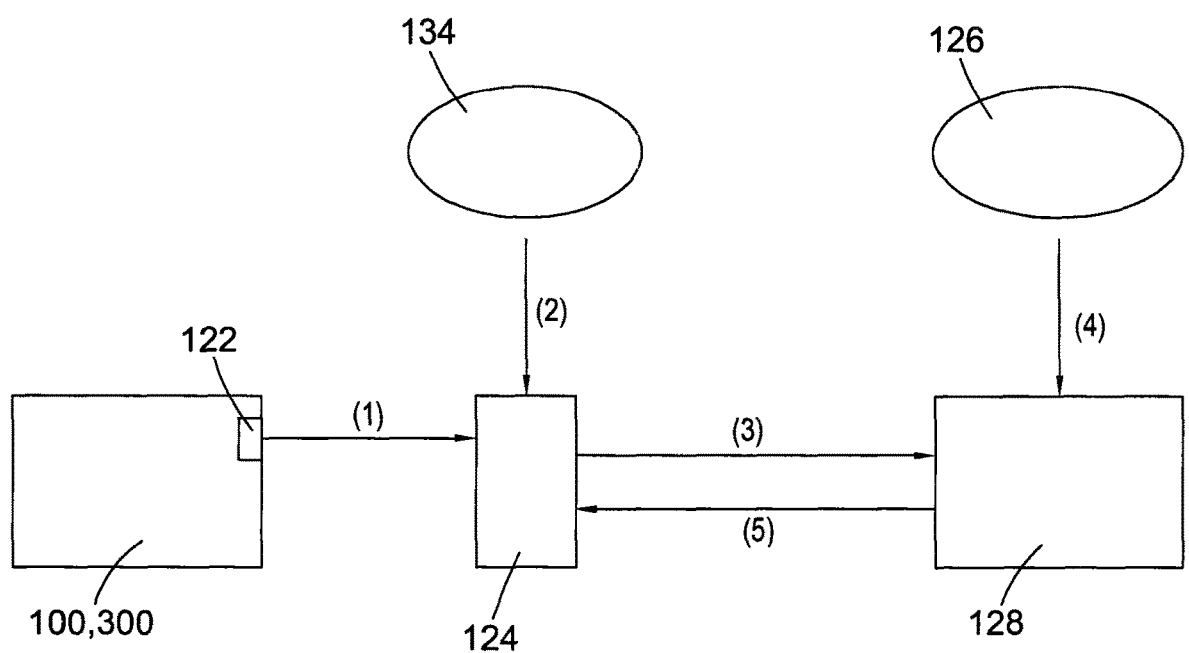
FIG. 13 shows a schematic arrangement of data being transmitted between a system, a mobile device and a remote device such as a server in order to determine: i) whether or not tampering has occurred with the system and ii) whether or not the system is in an allowable geographical location.

The exchange of data of the method described in relation to FIG. 12 is represented schematically by the arrows of in FIG. 13.

The system comprising bag 100, 300 transmits (1) signals via transmitter 122 to mobile device 124. The signals comprise encrypted key Series A or B, depending on whether or not the system has detected tampering. The mobile device 124 receives (2) geo-location information from mobile network 134, indicating the location of the mobile device 124 and therefore the approximate location of the system. Mobile device 124 sends (3) the received encrypted key signals and geo-location information to remote server 128. Remote server 128 compares (4) the encrypted key signals to database 126 in order to decrypt the keys and determine whether or not the system has detected tampering. The remote server 128 also determines whether the geo-location information indicates that the system is in an allowable location. The remote server then reports (5) either a pass or fail result accordingly to the mobile device.

The term "container" as used herein refers to any object capable of holding or storing a consumer item. Containers thus defined therefore include, but are not limited to, bags, boxes, envelopes, packaging and casings.

The term "mobile device" as used herein refers to any device capable of receiving and/or sending signals of the kind described in the various implementations. Mobile devices thus defined include, but are not limited to, mobile phones ("smart" or otherwise), tablets, portable computers, radio transmitters or any other device capable of sending and receiving wireless signals.

The term "remote device" and "remote server" as used herein refer to any device or plurality of devices operable to receive and analyse signals, such as those transmitted by a system of the present disclosure. Remote devices and remote servers thus defined therefore include, but are not limited to, computers, mobile devices and networks.

Singular terms "a" and "an" as used herein should not be taken to mean "one and only one". Rather, they should be taken to mean "at least one" or "one or more" unless stated otherwise.

The word "comprising" and its derivatives including "comprises" and "comprise" include each of the stated features, but does not exclude the inclusion of one or more further features.

The above implementations and exemplary use circumstances have been described by way of example only, and the described implementations are to be considered in all respects only as illustrative and not restrictive. It will be appreciated that variations of the described implementations may be made without departing from the scope of the disclosure. It will also be apparent that there are many variations that have not been described, but that fall within the scope of the appended claims.

The invention claimed is:

1. A system for securely transporting an item, the system comprising:
  a container comprising walls defining an inner cavity;
  a conductor for detecting tampering, wherein the conductor is contained within the walls of the container;

a continuity sensor configured to detect a discontinuity in the conductor; and a transmitter configured to transmit a signal indicative of whether the continuity sensor has detected a discontinuity in the conductor, wherein the transmitter is further configured to transmit a signal indicative of the continuity sensor having detected a discontinuity in the conductor after a pre-determined period of time has elapsed irrespective of whether the continuity sensor has actually detected a discontinuity, and wherein the conductor passes around, above and/or below the continuity sensor such that attempted removal of or tampering with the continuity sensor causes a discontinuity in the conductor.

2. The system of claim 1, wherein the conductor is a part of an electronic sensor module.

3. The system of claim 1, wherein the conductor is arranged in at least one of a mesh configuration and a wave configuration.

4. The system of claim 1, wherein the conductor is intermediate two layers of the walls of the container.

5. The system of claim 1, wherein the conductor is distributed throughout the walls of the container such that a break in the walls of the container causes the discontinuity in the conductor.

6. The system of claim 1, wherein the discontinuity in the conductor comprises at least one of a break in the conductor and a change in current flowing through the conductor.

7. The system of claim 1, wherein the transmitter is configured to continuously transmit the signal indicative of whether the continuity sensor has detected a discontinuity in the conductor.

8. The system of claim 1, wherein the transmitter is configured to transmit a first type of signal responsive to the continuity sensor not detecting a discontinuity in the conductor and a second type of signal responsive to the continuity sensor detecting a discontinuity in the conductor.

9. The system of claim 8, wherein the first type of signal comprises a first series of encrypted keys and the second type of signal comprises a second series of encrypted keys.

10. The system of claim 8 or 9, wherein the first series of encrypted keys and the second series of encrypted keys correspond with a database of keys, wherein the database of keys identifies that the first series of encrypted keys indicates that the continuity sensor has not detected a discontinuity in the conductor and that the second series of encrypted keys indicates that the continuity sensor has detected a discontinuity in the conductor.

11. The system of claim 10, wherein the database is stored in at least one of a remote device and a server.

12. The system of claim 1, wherein the container is sealable by at least one conductive sealing element.

13. The system of claim 1, wherein the container is sealable more than once.

14. A method for securely transporting an item using the system of claim 1, the method comprising:

detecting, by the continuity sensor, whether there has been a discontinuity in the conductor;

if a discontinuity in the conductor is detected, transmitting by the transmitter a first type of signal indicative of the continuity sensor having detected a discontinuity in the conductor; and if a pre-determined period of time has elapsed, transmitting by the transmitter the first type of signal indicative of the continuity sensor having detected a discontinuity in the conductor irrespective of whether the continuity sensor has actually detected a discontinuity.

15. The method of claim 14, further comprising:

if the pre-determined period of time has not elapsed and the continuity sensor has not detected a discontinuity in the conductor, transmitting by the transmitter a second type of signal indicative of the continuity sensor not having detected a discontinuity in the conductor.

16. The method of claim 14, further comprising:

determining, based on the transmitted signal, whether or not the system has detected tampering.

17. The method of claim 16, further comprising:

reporting, responsive to determining that the system has not detected tampering, a first type of result; and reporting, responsive to determining that the system has detected tampering, a second type of result.

18. The method of claim 16, further comprising:

receiving geo-location information indicating a location of the system.

19. The method of claim 18, wherein the geo-location information indicating the location of the system is compared to a database of locations to determine whether the system is in an allowable location.

20. The method of claim 19, further comprising:

reporting, responsive to determining that the system has not detected tampering and receiving geo-location information indicating that the location of the system is an allowable location, a first type of result; and reporting, responsive to determining that the system has detected tampering or receiving geo-location information indicating that the location of the system is an un-allowable location, a second type of result.

\* \* \* \* \*